(12) United States Patent
Tang et al.

(10) Patent No.: US 10,355,686 B2
(45) Date of Patent: *Jul. 16, 2019

(54) METHOD AND SYSTEM FOR RELIABLE BOOTSTRAPPING SWITCHES

(71) Applicant: Maxlinear, Inc., Carlsbad, CA (US)

(72) Inventors: Yongjian Tang, Carlsbad, CA (US); Xuefeng Chen, Carlsbad, CA (US)

(73) Assignee: Maxlinear, Inc., Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/057,499

(22) Filed: Aug. 7, 2018

(65) Prior Publication Data

US 2018/0351543 A1 Dec. 6, 2018

Related U.S. Application Data

(63) Continuation of application No. 15/793,581, filed on Oct. 25, 2017, now Pat. No. 10,050,614, which is a continuation of application No. 15/444,662, filed on Feb. 28, 2017, now Pat. No. 9,813,052, which is a continuation of application No. 14/585,707, filed on Dec. 30, 2014, now Pat. No. 9,584,112.

(60) Provisional application No. 61/921,971, filed on Dec. 30, 2013.

(51) Int. Cl.
*H03K 17/06* (2006.01)
*H03K 17/687* (2006.01)

(52) U.S. Cl.
CPC ......... *H03K 17/063* (2013.01); *H03K 17/687* (2013.01); *H03K 2217/0054* (2013.01)

(58) Field of Classification Search
CPC .......... H03K 17/063; H03K 19/01714; H03K 19/01735; H02M 3/07; G11C 5/145
USPC ......................................................... 327/390
See application file for complete search history.

(56) References Cited

U.S. PATENT DOCUMENTS

| 4,139,935 | A | 2/1979 | Bertin |
| 9,165,664 | B2 | 10/2015 | D'Alessandro |
| 2007/0046359 | A1 | 3/2007 | Zanchi |

*Primary Examiner* — Lincoln D Donovan
*Assistant Examiner* — Diana J. Cheng
(74) *Attorney, Agent, or Firm* — McAndrews, Held & Malloy (57) ABSTRACT

Methods and systems for reliable bootstrapping switches may comprise sampling a received signal with a bootstrapping switch, where the bootstrapping switch comprises a switching metal-oxide semiconductor (MOS) transistor having a pull-down path coupled to a gate terminal of the switching MOS transistor, wherein: source terminals of both a diode-connected transistor and a second MOS transistor are coupled to the gate terminal of the switching MOS transistor; drain terminals of both the diode-connected transistor and the second MOS transistor are coupled to a source terminal of a third MOS transistor, the third MOS transistor coupled in series with a fourth MOS transistor; and a drain terminal of the fourth MOS transistor is coupled to ground. The third and fourth MOS transistors may be in series with the second MOS transistor. A gate terminal of the fourth transistor may be switched from ground to a supply voltage to activate the pull-down path.

20 Claims, 10 Drawing Sheets

METHOD AND SYSTEM FOR RELIABLE BOOTSTRAPPING SWITCHES

CROSS-REFERENCE TO RELATED APPLICATIONS/INCORPORATION BY REFERENCE

This application is a continuation of U.S. patent application Ser. No. 15/793,581, filed on Oct. 25, 2017, which is a continuation of U.S. patent application Ser. No. 15/444,662 filed on Feb. 28, 2017, now U.S. Pat. No. 9,813,052, which is a continuation of U.S. patent application Ser. No. 14/585,707 filed on Dec. 30, 2014, now U.S. Pat. No. 9,584,112, which makes reference to and claims priority to U.S. Provisional Application Ser. No. 61/921,971 filed on Dec. 30, 2013. Each of the above identified applications is hereby incorporated herein by reference in its entirety.

FIELD

Certain embodiments of the disclosure relate to communication. More specifically, certain embodiments of the disclosure relate to a method and system for reliable bootstrapping switches.

BACKGROUND

Conventional approaches to bootstrapping switches often result in premature device aging and eventually device failure. Further limitations and disadvantages of conventional and traditional approaches will become apparent to one of skill in the art, through comparison of such systems with some aspects of the present disclosure as set forth in the remainder of the present application with reference to the drawings.

Further limitations and disadvantages of conventional and traditional approaches will become apparent to one of skill in the art, through comparison of such systems with the present disclosure as set forth in the remainder of the present application with reference to the drawings.

BRIEF SUMMARY

A system and/or method for reliable bootstrapping switches substantially as shown in and/or described in connection with at least one of the figures, as set forth more completely in the claims.

Various advantages, aspects and novel features of the present disclosure, as well as details of an illustrated embodiment thereof, will be more fully understood from the following description and drawings.

DETAILED DESCRIPTION

Certain aspects of the disclosure may be found in a method and system for reliable bootstrapping switches. Exemplary aspects may comprise sampling a received signal with a bootstrapping switch that comprises a switching metal-oxide semiconductor (MOS) transistor having a pull-down path coupled to a gate terminal of the switching MOS transistor. The pull-down path comprises a diode-connected MOS transistor coupled in parallel with a second MOS transistor that couples the gate terminal of the switching MOS transistor to ground via third and fourth MOS transistors when the switching MOS transistor is in an OFF state. The third and fourth MOS transistors may be in series with the second MOS transistor. A gate terminal of the fourth transistor may be switched from ground to a supply voltage, VDD, to activate the pull-down path. A capacitor may be coupled between gate and source terminals of the switching MOS transistor to switch said switching MOS transistor to an ON state. The capacitor may be coupled to ground and a supply voltage to switch said switching MOS transistor to the OFF state. The fourth MOS transistor may be configured in an OFF state for switching the switching MOS transistor to the ON state. MOS transistors in the pull-down path may be protected from voltages with a magnitude above a supply voltage for the bootstrapping switch utilizing the diode-connected MOS transistor. The bootstrapping switch may sample analog signals in an analog-to-digital converter (ADC). The bootstrapping switch may be integrated on a complementary metal-oxide semiconductor (CMOS) chip. The bootstrapping switch may comprise NMOS transistors.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

Figure 1A:
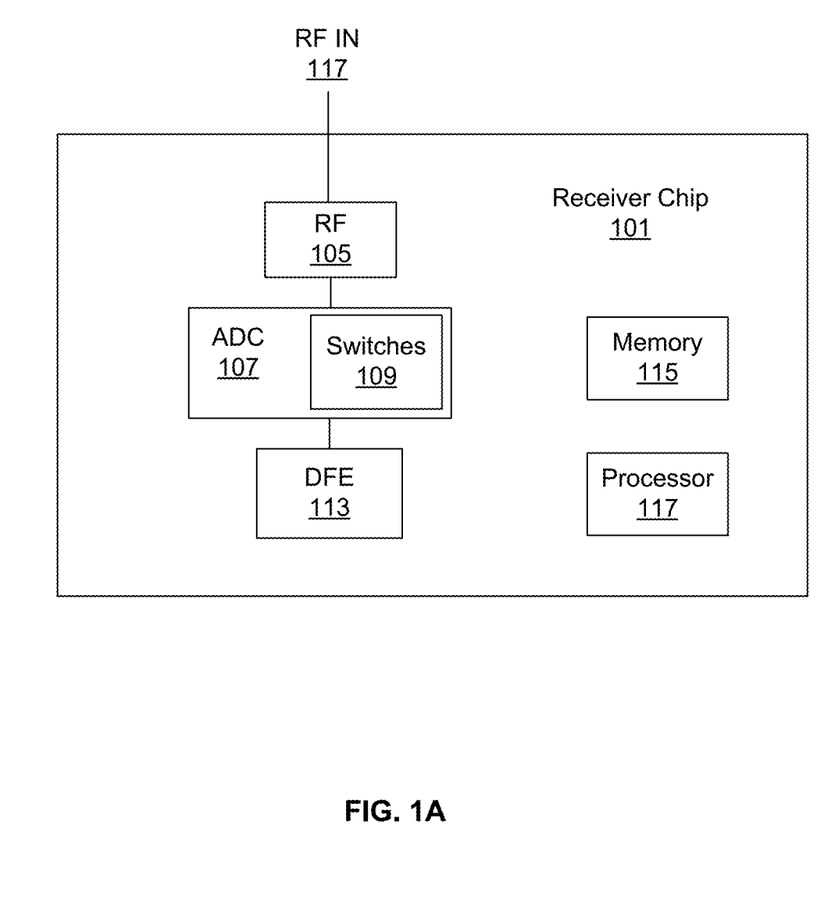
FIG. 1A is a diagram of an example communication device with reliable bootstrapping switches, in accordance with an embodiment of the disclosure.

FIG. 1A is a diagram of an exemplary communication device with reliable bootstrapping switches, in accordance with an example embodiment of the disclosure. Referring to FIG. 1A, there is shown a receiver 101 chip comprising a radio frequency (RF) module 105, an analog to digital converter (ADC) 107, a digital front end (DFE) 113, a memory 115, and a processor 117. In an example scenario, the receiver chip comprises a single CMOS chip. In another example scenario, the receiver chip comprises a plurality of chips.

The receiver 101 may be in or part of a transceiver, for example, and may be utilized for receiving satellite television signals, cable television signals, or any RF signal carrying multiple channels of data desired by a user. In an example scenario, the receiver 101 may comprise a set-top box. In this example, the receiver 101 may be operable to receive satellite, cable, or terrestrial television signals, down-convert and process the signals for communication to a display device, such as a television, for example.

The RF module 105 may comprise one or more RF receive (Rx) and transmit (Tx) paths for receiving signals from a satellite system, cable TV head-end, and/or terrestrial TV antennas, for example. The RF module 105 may comprise impedance matching elements, LNAs, power amplifiers, variable gain amplifiers, and filters, for example. The RF module 105 may thus be operable to receive, amplify, and filter RF signals before communicating them to the ADC 107.

The ADC 107 may comprise a wideband and/or time-interleaved ADC and may be operable to convert received analog signals to digital signals. In an example scenario, the ADC 107 may comprise a direct-sampled ADC and may comprise two parallel ADC paths, each sampling 180 degrees out of phase with each other, resulting in a total sampling rate that is double that of each individual path. For example, if each ADC path samples at 2.5 GHz, the resulting sampling rate for the signal communicated to the digital front end 113 is 5.0 GHz.

The ADC 107 may comprise switches 109, which may be utilized to sample received analog signals. Under certain operational conditions, the sampled voltage may be high enough to cause damage to transistors in the signal path, reducing the reliability of the switches. The switches 109 may comprise CMOS transistors, for example, that may suffer from hot carrier injection and dielectric breakdown when operating with high input voltages. In an example scenario, the switches 109 may be configured in a bootstrapping configuration with protection devices to withstand high input voltages without losing performance.

The digital front end 113 may comprise circuitry for receiving samples from the ADC 107 and communicating them in a single data stream to the processor 117. The processor 117 may comprise a general purpose processor, such as a reduced instruction set computing (RISC) processor, for example, that may be operable to control the functions of the receiver 101. For example, the processor 117 may configure the switches 109 in an open or closed position. Additionally, the processor 117 may demodulate baseband signals received from the digital front end 113.

The memory 115 may comprise a programmable memory module that may be operable to store software and data, for example, for the operation of the receiver 101. Furthermore, the memory 115 may store open/closed states for the switches 109 in the ADC 107.

In an example scenario, one or more protection transistors may be connected in parallel with a diode-connected transistor in the pull-down path of a switching transistor. In this manner, the bootstrapping switching transistor may be switched off quickly during an On-Off transition, the gate node may be pulled down to ground during the Off state, and all devices in the pull-down path may be subjected to normal operating voltages.

Figure 1B:
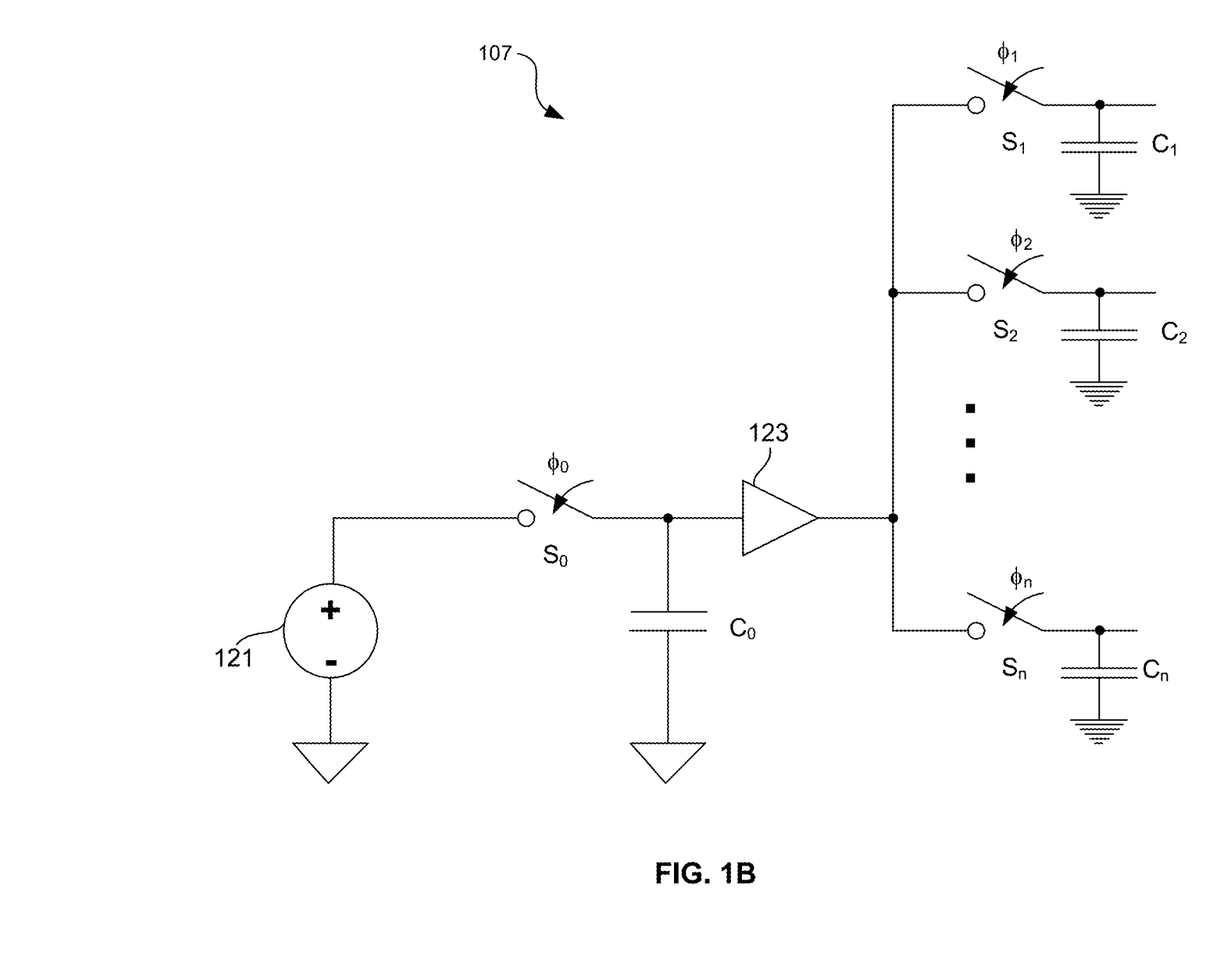
FIG. 1B is a diagram illustrating an analog-to-digital converter utilizing reliable bootstrapping switches, in accordance with an example embodiment of the disclosure.

FIG. 1B is a diagram illustrating an analog-to-digital converter utilizing reliable bootstrapping switches, in accordance with an example embodiment of the disclosure. Referring to FIG. 1B, there is shown an ADC 107 comprising switches $S_0$-$S_n$, capacitors $C_0$-$C_n$, where n indicates the number of sampling channels, and a buffer 123. There is also shown an input voltage 121 coupled to the switch $S_0$.

The switches may be operable to sample the input voltage 121, with the sampling timing driven by the timing signals $\phi_0$-$\phi_n$. The switches $S_0$-$S_n$ may comprise CMOS transistors, for example, that may be configured in open/closed positions by applying low/high gate voltages, respectively, for NMOS transistors. In instances where the input voltage 121 is high and no protective circuitry is utilized in the switches $S_0$-$S_n$, they may be damaged slightly, or catastrophically, shortening their operational lifetime.

In an example scenario, one or more protection transistors may be connected in parallel with a diode-connected transistor in the pull-down path of the switches $S_0$-$S_n$. In this manner, the bootstrapping switching transistor may be switched off quickly during an On-Off transition, the gate node may be pulled down to ground during the Off state, and all devices in the pull-down path may be subjected to normal operating voltages.

Figure 1C:
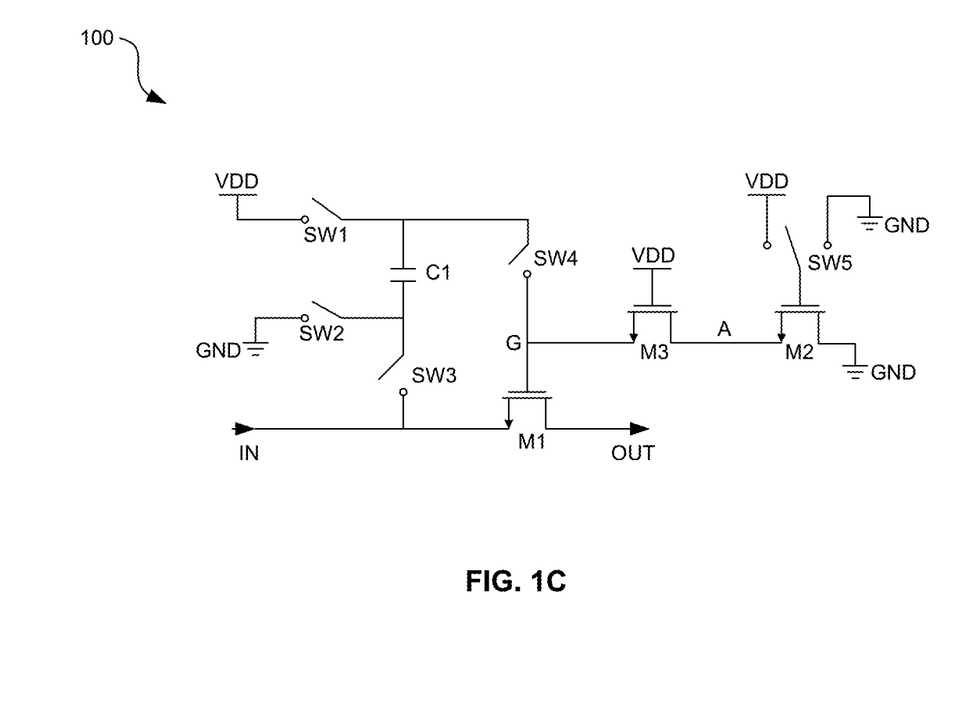
FIG. 1C is a diagram illustrating an example bootstrapping switch.

FIG. 1C is a diagram illustrating an example bootstrapping switch. The bootstrapping switch 100, which may represent one of the switches $S_0$-$S_n$, for example, may comprise a subswitch SW1, subswitch SW2, subswitch SW3, subswitch SW4, subswitch S5, transistor M1, transistor M2, and transistor M3.

The transistor M1 may operate as the primary switch making and breaking the connection between IN and the output port ("OUT"). When M1 is closed, the signal on the input port ("IN") may be conveyed to the output port ("OUT"), and when M1 is open, IN may be isolated from OUT.

Figure 1D:
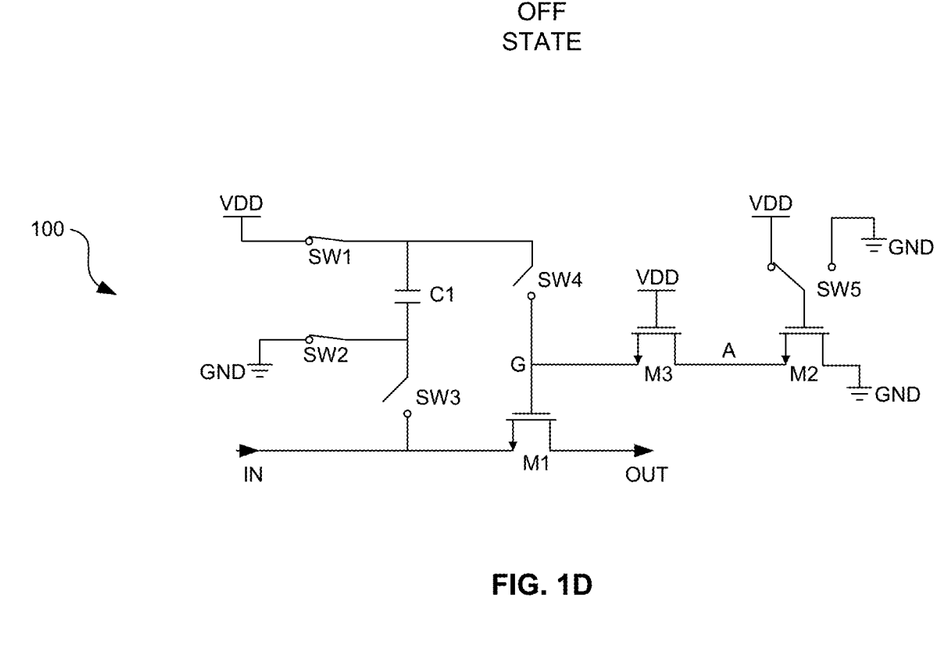
FIG. 1D is a diagram illustrating the bootstrapping switch of FIG. 1C in an off state.

FIG. 1D is a diagram illustrating the bootstrapping switch of FIG. 1C in an off state. In the off state, switches SW1 and SW2 may be closed so that the top and bottom plates of the capacitor C1 connect to VDD and GND, respectively. Switches SW3 and SW4 are open. With SW5 switched to VDD, transistor M2 may be turned on. Transistors M2 and M3 together form a pull-down path so that both node A and node G are pulled down to GND. As a result, switch M1 may be OFF and OUT may be disconnected from IN.

Figure 1E:
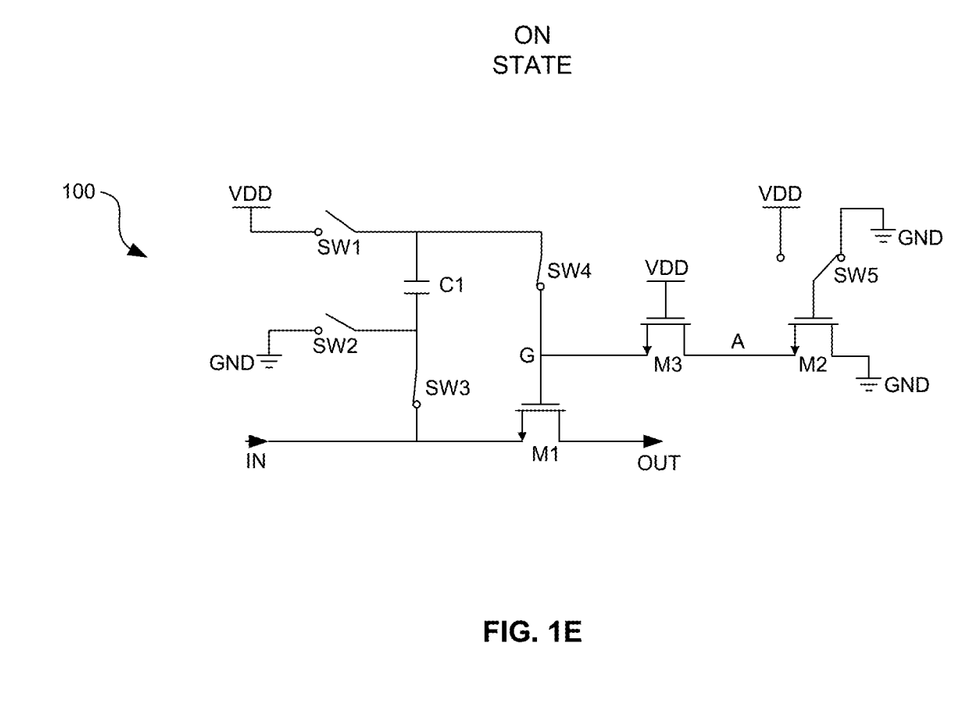
FIG. 1E is a diagram illustrating the bootstrapping switch of FIG. 1C in an on state.

FIG. 1E is a diagram illustrating the bootstrapping switch of FIG. 1C in an on state. In the on state, SW1, SW2 and M2 may be open, while SW3 and SW4 may be closed. The bottom plate of the capacitor C1 may thus be connected to the input, or gate terminal, of transistor M1. Consequently, the voltage of the top plate of the capacitor C1, i.e., the voltage at node G, may be boosted to VIN+VDD. Switch M1 may therefore be ON and OUT is connected to IN. The switching resistance of M1 may be constant because the gate-source overdrive voltage is then always VDD, regardless of the voltage at the input.

A goal of the bootstrapping switch 100 may be to achieve constant switching resistance when the switch M1 is turned on, independent of the amplitude and frequency of the input signal. This may be achieved by keeping the voltage difference between the gate of the switch M1 and the input signal constant. The voltage difference may typically be at the supply voltage (VDD). The bootstrapping switch 100 may be used, for example, in a sampler, analog-to-digital converter (ADC), digital-to-analog converter (DAC), and/or the like to achieve high linearity and low distortion. One issue with the bootstrapping switch 100 may be voltage overstress, as described below with reference to FIG. 2.

Figure 2:
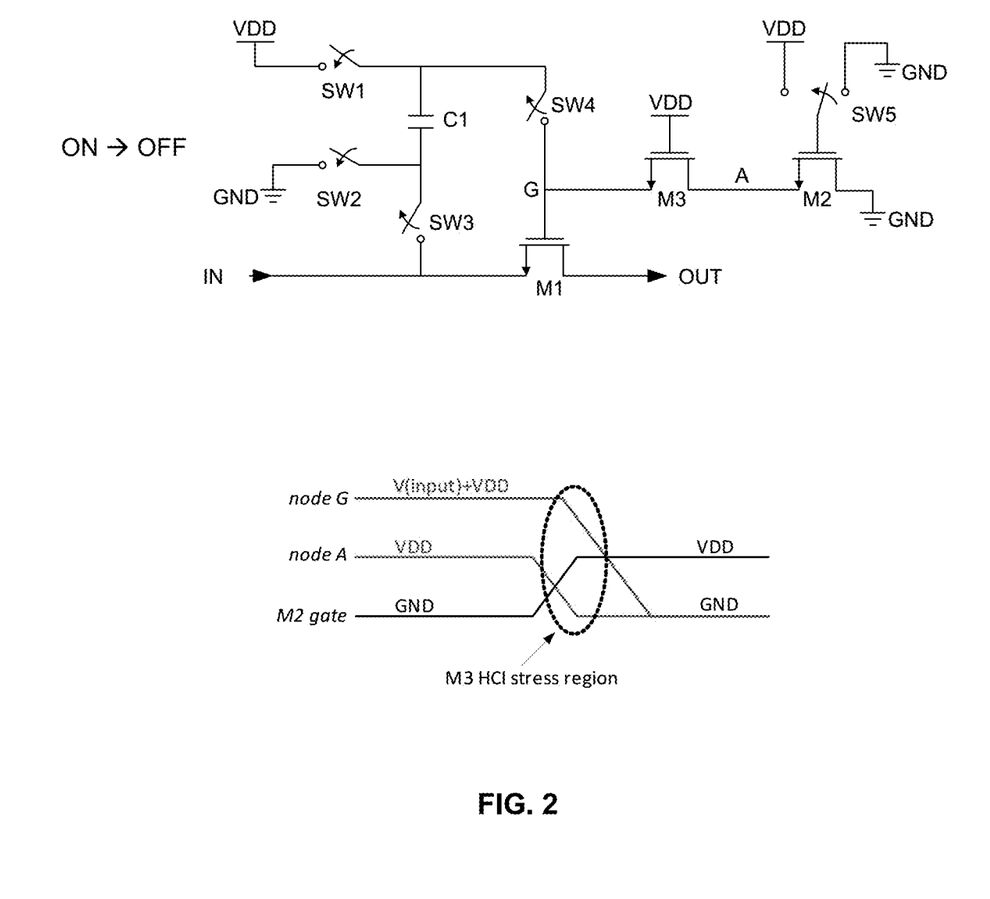
FIG. 2 is a diagram illustrating the bootstrapping switch of FIG. 1C, and the voltage on various nodes of the bootstrapping switch, during a transition from the on state to the off state.

FIG. 2 is a diagram illustrating bootstrapping switch of FIG. 1C, and the voltage on various nodes of the bootstrapping switch, during a transition from the on state to the off state. As shown in FIG. 2, since the node G may be boosted significantly higher than the supply voltage, the devices in bootstrapping switches may encounter voltage overstress issues, such as Hot-Carrier Injection (HCI) and Time-Dependent Dielectric Breakdown (TDDB). Voltage overstress may degrade the performance of transistors over time, and may cause permanent catastrophic damage to the devices. Device aging due to overstress may be proportional to the stress condition and the overstress time. The devices in the pull-down path are most susceptible to this issue. The bootstrapping switch 100 of FIGS. 1C-1E may utilize M3 as a protection device to avoid the voltage at node A going above VDD, so that M2 is protected. However, this approach doesn't protect M3 itself, especially when the voltage of the input signal is very high. As shown in FIG. 2, during M2 and M3 turn off, M3 is exposed to a very large drain-source overdrive voltage, i.e., V(node G)-V(node A). This can cause a severe HCI issue for M3.

Figure 3:
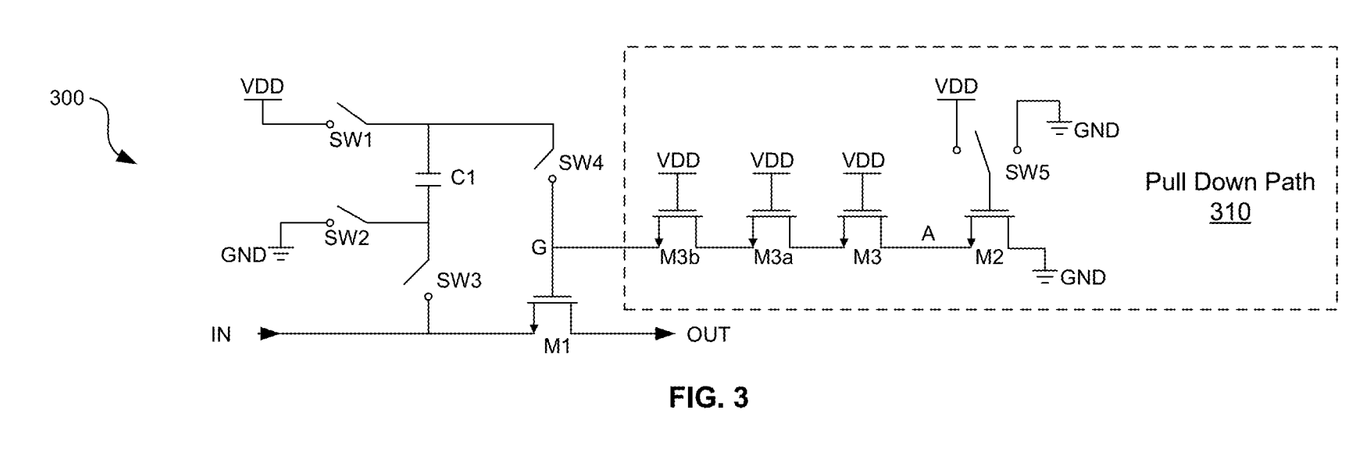
FIG. 3 is a diagram illustrating a first alternate implementation of a bootstrapping switch.

FIG. 3 is a diagram illustrating a first alternate implementation of a bootstrapping switch. Stacking one or more protection devices into the pull-down path 310, such as M3a and M3b, is one way to address overstress. One drawback of this approach is that it can reduce the performance of bootstrapping switches since the turning-off time for M1 becomes much longer due to more transistors in series (i.e., higher impedance), in the pull-down path 310. Slower turn-off may make the bootstrapping switch more sensitive to noise and supply disturbance.

Figure 4:
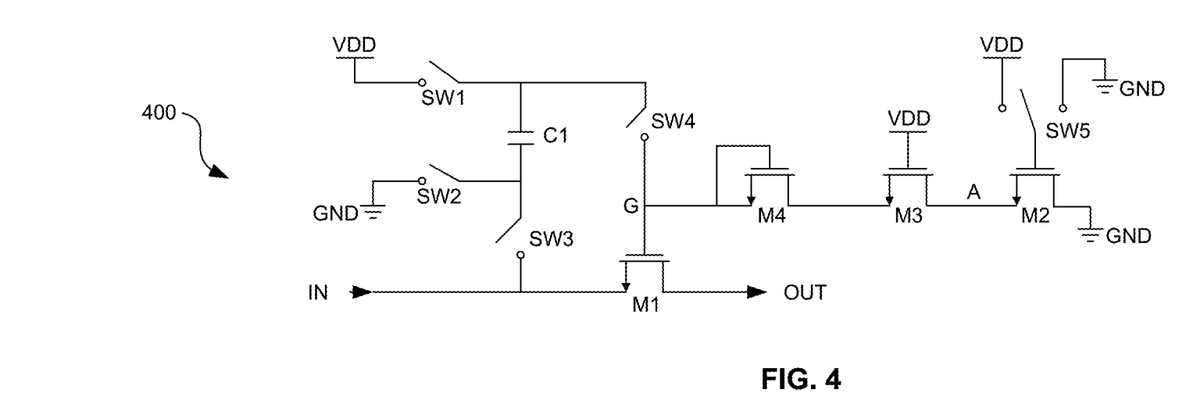
FIG. 4 is a diagram illustrating a second alternate implementation of a bootstrapping switch.

FIG. 4 is a diagram illustrating a second alternate implementation of a bootstrapping switch. Adding one or more diode-connected devices in cascode with M2 and M3, such as M4 shown in FIG. 4, is another way to address the overstress issue on M3 since M4 generates a voltage drop from node G. However, a drawback of this circuit topology is that the node G cannot be hard pulled down to GND during the OFF state. This can cause signal-dependent leakage current between IN and OUT, which may degrade the performance of the bootstrapping switch.

Figure 5:
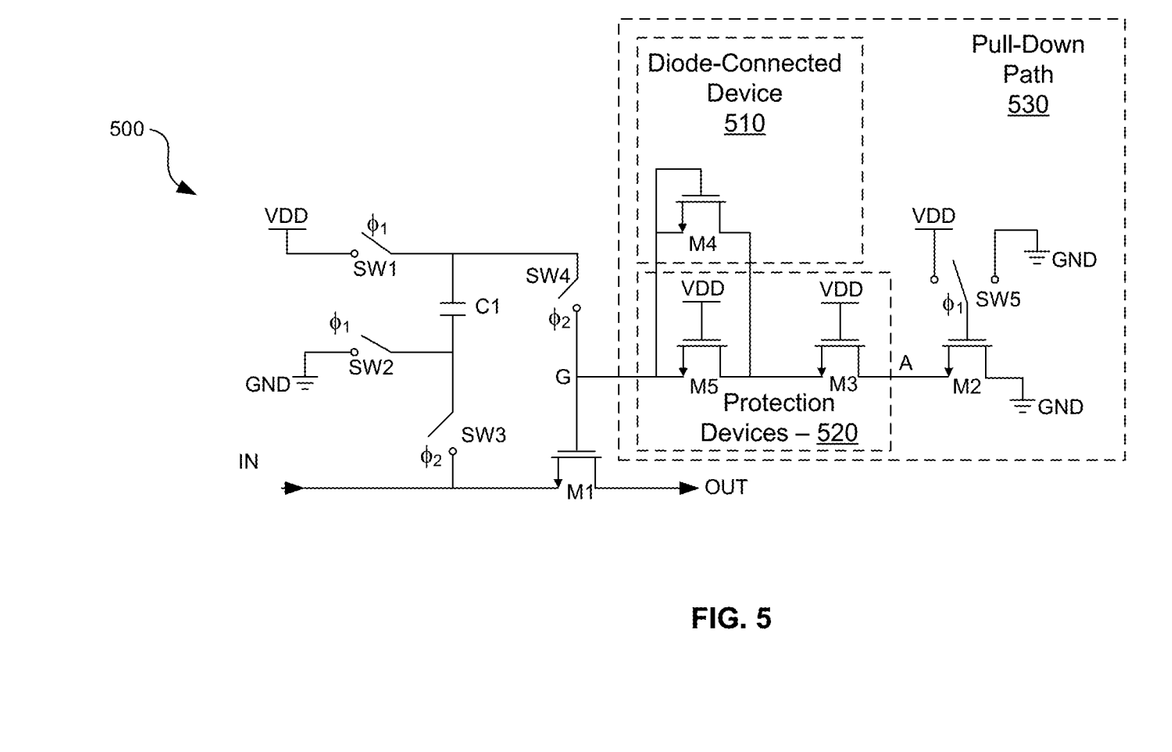
FIG. 5 is a diagram illustrating a third alternate implementation of a bootstrapping switch.

FIG. 5 is a diagram illustrating a third alternate implementation of a bootstrapping switch. The bootstrapping switch 500 may comprise a combination of the techniques used in bootstrapping switches 300 (FIGS. 3) and 400 (FIG. 4), and may incorporate any or all aspects of FIGS. 1A-4. The bootstrapping switch 500 may comprise subswitches SW1-SW5, transistors M1-M5, and capacitor C1. The transistor M4 may comprise a diode-connected MOS device, with its gate terminal coupled to its source terminal.

The bootstrapping switch 500 may comprise a pull-down path 530, which in turn comprises protection devices 520, a diode connected device 510, SW5, and M2. The diode connected device 510 in this example comprises a diode connected NMOS transistor M4 and the protection devices 520 comprise the NMOS transistors M3 and M5. It should be noted that the bootstrapping switch 500 is not limited to NMOS devices, as PMOS or other types of transistors may be utilized.

In the bootstrapping switch 500, diode-connected device 510 (M4) may be inserted between node G and transistor M3 to generate a voltage drop between the node G and M3. Also, a second protection device M5 may be inserted in parallel with M4 to hard pull the node G to GND during the OFF state when SW5 is switched to VDD and transistor M2 is ON.

The timing signals $\phi_1$ and $\phi_2$ may be utilized to configure the bootstrapping switch 500 in an open or closed position. For example, $\phi_1$ may be utilized to close subswitches SW1 and SW2 and to configure SW5 to VDD, while $\phi_2$ opens switches SW3 and SW4. In this configuration, the bootstrapping switch 500 is OFF (open), as the transistors M2, M3, and M5 are ON, pulling node G to ground, meaning transistor M1 is OFF, and VDD is applied across the capacitor C1, charging it to VDD volts.

Alternatively, $\phi_1$ may be utilized to open subswitches SW1 and SW2 and configure SW5 to GND, while $\phi_2$ closes switches SW3 and SW4. In this configuration, the bootstrapping switch 500 is ON (closed) since the voltage on C1 is applied from gate to source of M1, and the transistors M2, M3, and M5 are OFF. In this state, the voltage at node G may have a magnitude above the supply voltage VDD, with a voltage of VDD+VIN, and M1 is ON.

Through the use of M4 and M5 in bootstrapping switch 500, M1 can be turned off quickly during an ON to OFF transition, and the node G may be hard pulled down to GND during the OFF state. The devices in the pull-down path 530 may then operate in a normal voltage range, mitigating the overstress issue without performance degradation.

Figure 6:
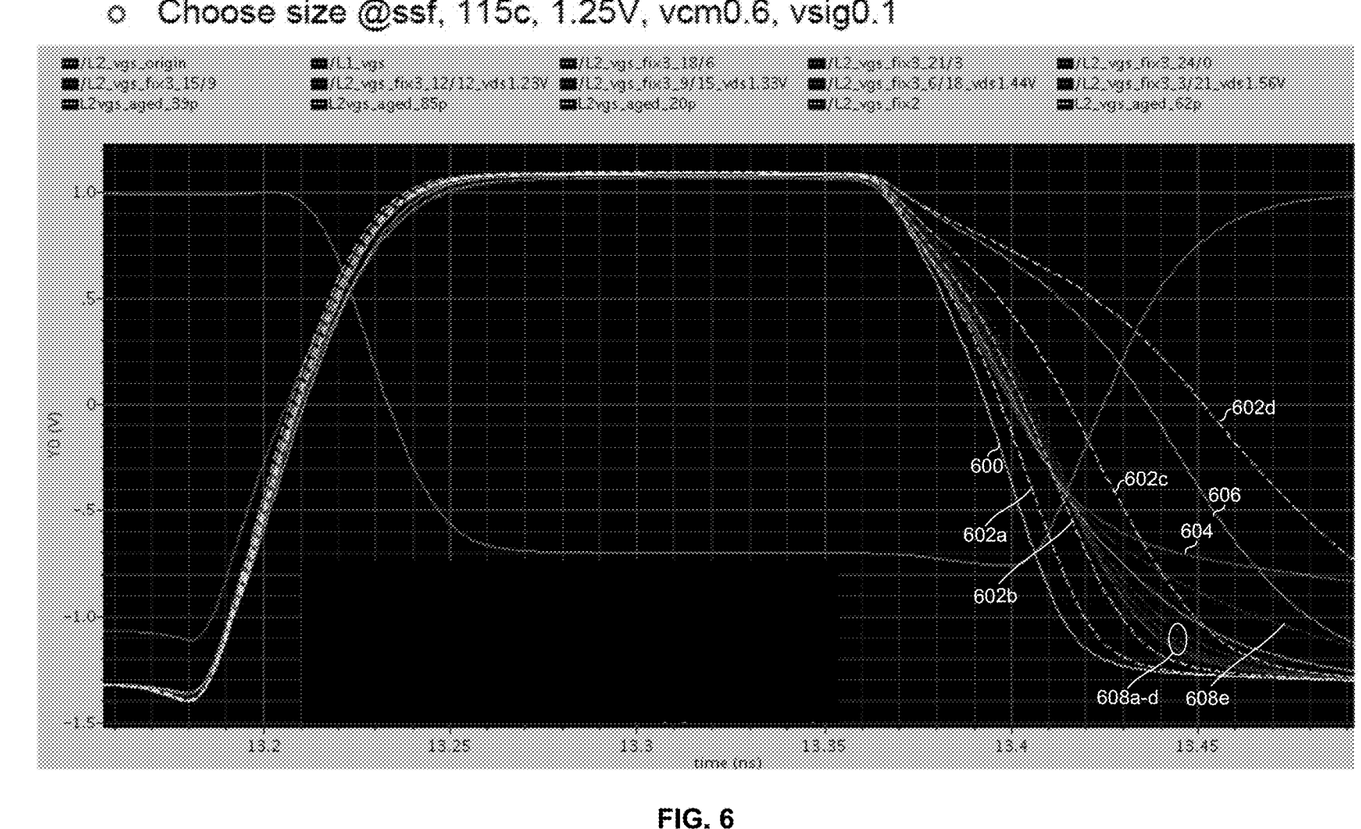
FIG. 6 depicts simulation results for the bootstrapping switches shown in FIGS. 1C, 3, 4, and 5.

FIG. 6 depicts simulation results for the bootstrapping switches shown in FIGS. 1C, 3, 4, and 5. The line 600 shows the voltage on node G during an on to off transition. Line 600 corresponds to the bootstrapping switch 100 without any aging of the transistor M3. Lines 602a-602d correspond to 20%, 39%, 62%, and 85% aging, respectively, of the transistor M3. Line 604 corresponds to the bootstrapping switch 300 of FIG. 3. Line 606 corresponds to the bootstrapping switch 400 of FIG. 4. Lines 608a-608e correspond to five implementations of the bootstrapping switch 500 of FIG. 5 having five different device sizes.

In an embodiment of the disclosure, a method and system for reliable bootstrapping switches may comprise one or more circuits comprising a bootstrapping switch. The bootstrapping switch comprises a switching metal-oxide semiconductor (MOS) transistor having a pull-down path coupled to a gate terminal of the switching MOS transistor. The pull-down path comprises a diode-connected MOS transistor coupled in parallel with a second MOS transistor that couples the gate terminal of the switching MOS transistor to ground via third and fourth MOS transistors when the switching MOS transistor is in an OFF state.

The third and fourth MOS transistors may be in series with the second MOS transistor. The one or more circuits may be operable to switch a gate terminal of the fourth transistor from ground to a supply voltage, VDD, to activate the pull-down path. The one or more circuits may be operable to couple a capacitor between gate and source terminals of the switching MOS transistor to switch the switching MOS transistor to an ON state. The one or more circuits may be operable to couple the capacitor to ground and a supply voltage to switch the switching MOS transistor to the OFF state.

The one or more circuits may be operable to configure the fourth MOS transistor in an OFF state for switching the switching MOS transistor to the ON state. The one or more circuits may be operable to protect MOS transistors in the pull-down path from voltages with a magnitude above a supply voltage for the bootstrapping switch utilizing the diode-connected MOS transistor. The one or more circuits may be operable to sample analog signals utilizing the bootstrapping switch in an analog-to-digital converter (ADC). The one or more circuits may comprise a complementary metal-oxide semiconductor (CMOS) chip.

Other embodiments of the disclosure may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for reliable bootstrapping switches.

Accordingly, aspects of the disclosure may be realized in hardware, software, firmware or a combination thereof. The disclosure may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present disclosure may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present disclosure may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present disclosure.

While the disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiments disclosed, but that the present disclosure will include all embodiments falling within the scope of the appended claims.

What is claimed is:

1. A method for communication, the method comprising:
   sampling a received signal with a switch, said switch comprising a switching metal-oxide semiconductor (MOS) transistor with its gate terminal coupled to a pull-down path, said pull-down path comprising:
      a diode-connected transistor and a second MOS transistor, each having first terminals that are coupled to the gate terminal of the switching MOS transistor; and
      a third MOS transistor having a first terminal that is coupled to second terminals of both the diode-connected transistor and the second MOS transistor and having a second terminal that is coupled to a first terminal of a fourth MOS transistor.

2. The method according to claim 1, wherein the third and fourth MOS transistors are in series with the second MOS transistor.

3. The method according to claim 1, comprising switching a gate terminal of the fourth MOS transistor from ground to a supply voltage, VDD, to activate the pull-down path.

4. The method according to claim 1, comprising coupling a capacitor between gate and source terminals of the switching MOS transistor to switch said switching MOS transistor to an ON state.

5. The method according to claim 4, comprising coupling said capacitor to ground and a supply voltage to switch said switching MOS transistor to an OFF state.

6. The method according to claim 5, comprising configuring said fourth MOS transistor in an OFF state for switching said switching MOS transistor to said ON state.

7. The method according to claim 1, comprising protecting MOS transistors in said pull-down path from voltages with a magnitude above a supply voltage for said switch utilizing said diode-connected transistor.

8. The method according to claim 1, wherein said switch samples analog signals in an analog-to-digital converter (ADC).

9. The method according to claim 1, wherein the switch is integrated on a complementary metal-oxide semiconductor (CMOS) chip.

10. The method according to claim 1, wherein the switch comprises NMOS transistors.

11. A system for communication, the system comprising:
    one or more circuits comprising a switch, said switch comprising a switching metal-oxide semiconductor (MOS) transistor with its gate terminal coupled to a pull-down path, said pull-down path comprising:
       a diode-connected transistor and a second MOS transistor, each having first terminals that are coupled to the gate terminal of the switching MOS transistor; and
       a third MOS transistor having a first terminal that is coupled to second terminals of both the diode-connected transistor and the second MOS transistor and having a second terminal that is coupled to a first terminal of a fourth MOS transistor.

12. The system according to claim 11, wherein the third and fourth MOS transistors are in series with the second MOS transistor.

13. The system according to claim 11, wherein said one or more circuits are operable to switch a gate terminal of the fourth MOS transistor from ground to a supply voltage, VDD, to activate the pull-down path.

14. The system according to claim 11, wherein said one or more circuits are operable to couple a capacitor between gate and source terminals of the switching MOS transistor to switch said switching MOS transistor to an ON state.

15. The system according to claim 14, wherein said one or more circuits are operable to couple said capacitor to ground and a supply voltage to switch said switching MOS transistor to an OFF state.

16. The system according to claim 15, wherein said one or more circuits are operable to configure said fourth MOS transistor in an OFF state for switching said switching MOS transistor to said ON state.

17. The system according to claim 11, wherein said one or more circuits are operable to protect MOS transistors in said pull-down path from voltages with a magnitude above a supply voltage for said switch utilizing said diode-connected transistor.

18. The system according to claim 11, wherein said one or more circuits are operable to sample analog signals utilizing said switch in an analog-to-digital converter (ADC).

19. The system according to claim 11, wherein the one or more circuits comprises a complementary metal-oxide semiconductor (CMOS) chip.

20. A system for communication, the system comprising:
one or more circuits comprising a switching metal-oxide semiconductor (MOS) transistor having a pull-down path, said pull-down path comprising:
first terminals of both a diode-connected MOS transistor and a second MOS transistor coupled to the gate terminal of the switching MOS transistor;
a first terminal of a third MOS transistor is coupled to a second terminal of the second MOS transistor;
a first terminal of a fourth MOS transistor is coupled to a second terminal of the third MOS transistor; and
second terminals of both the diode-connected transistor and the second MOS transistor are coupled to a first terminal of the third MOS transistor.

* * * * *